(12) United States Patent
Liao et al.

(10) Patent No.: US 11,450,769 B2
(45) Date of Patent: Sep. 20, 2022

(54) TRANSISTOR WITH ASYMMETRIC SOURCE AND DRAIN REGIONS

(71) Applicant: TAIWAN SEMICONDUCTOR MANUFACTURING COMPANY LIMITED, Hsinchu (TW)

(72) Inventors: Hsien-Yuan Liao, Hsinchu (TW); Chien-Chih Ho, Hsinchu (TW); Chi-Hsien Lin, Taichung (TW); Hua-Chou Tseng, Hsinchu (TW); Ho-Hsiang Chen, Hsinchu (TW); Ru-Gun Liu, Hsinchu County (TW); Tzu-Jin Yeh, Hsinchu (TW); Ying-Ta Lu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/183,496

(22) Filed: Feb. 24, 2021

(65) Prior Publication Data
US 2021/0184036 A1    Jun. 17, 2021

Related U.S. Application Data

(62) Division of application No. 16/385,275, filed on Apr. 16, 2019, now Pat. No. 10,964,814, which is a
(Continued)

(51) Int. Cl.
*H01L 29/78* (2006.01)
*H01L 21/28* (2006.01)
*H01L 21/3213* (2006.01)
*H01L 29/08* (2006.01)
*H01L 29/423* (2006.01)
(Continued)

(52) U.S. Cl.
CPC .... *H01L 29/7835* (2013.01); *H01L 21/28035* (2013.01); *H01L 21/28132* (2013.01); *H01L 21/32133* (2013.01); *H01L 29/0847* (2013.01); *H01L 29/42376* (2013.01); *H01L 29/4916* (2013.01); *H01L 29/6656* (2013.01); *H01L 29/66659* (2013.01); *H01L 29/66795* (2013.01);
(Continued)

(58) Field of Classification Search
CPC .......... H01L 29/7835; H01L 21/28035; H01L 21/28132; H01L 21/32133; H01L 29/0847; H01L 29/42376; H01L 29/4916; H01L 29/6656; H01L 29/66659; H01L 29/66795; H01L 29/785; H01L 29/7851; H01L 29/78; H01L 29/78624
See application file for complete search history.

(56) References Cited

U.S. PATENT DOCUMENTS 8,299,564 B1   10/2012  Wu et al.
2007/0032063 A1  2/2007  Sutardja
(Continued)

*Primary Examiner* — Shahed Ahmed
(74) *Attorney, Agent, or Firm* — Jones Day

(57) ABSTRACT

Semiconductor structures and methods for forming a semiconductor structure are provided. An active semiconductor region is disposed in a substrate. A gate is formed over the substrate. Source and drain regions of a transistor are formed in the active semiconductor region on opposite sides of the gate. The drain region has a first width, and the source region has a second width that is not equal to the first width.

20 Claims, 8 Drawing Sheets

Related U.S. Application Data division of application No. 15/341,385, filed on Nov. 2, 2016, now Pat. No. 10,276,716.

(60) Provisional application No. 62/342,406, filed on May 27, 2016.

(51) Int. Cl.
*H01L 29/49* (2006.01)
*H01L 29/66* (2006.01)

(52) U.S. Cl.
CPC ........ *H01L 29/785* (2013.01); *H01L 29/7851* (2013.01)

(56) References Cited

U.S. PATENT DOCUMENTS

| | | | |
|---|---|---|---|
| 2010/0171182 A1 | 7/2010 | Shin et al. | |
| 2011/0303950 A1 | 12/2011 | Lauer et al. | |
| 2012/0098072 A1 | 4/2012 | Han et al. | |
| 2014/0084374 A1* | 3/2014 | Huang | G06F 30/39 716/110 |
| 2015/0318181 A1* | 11/2015 | Cantone | H01L 21/823431 438/702 |
| 2017/0110374 A1 | 4/2017 | Xu et al. | |
| 2017/0271167 A1 | 9/2017 | He et al. | |

* cited by examiner

TRANSISTOR WITH ASYMMETRIC SOURCE AND DRAIN REGIONS

CROSS-REFERENCE TO RELATED APPLICATIONS

This application is a divisional application of U.S. patent application Ser. No. 16/385,275, filed Apr. 16, 2019, entitled "Transistor with Asymmetric Source and Drain Regions"; which is a divisional application of U.S. patent application Ser. No. 15/341,385, filed Nov. 2, 2016, entitled "Transistor with Asymmetric Source and Drain Regions," and issued Apr. 30, 2019 as U.S. Pat. No. 10,276,716; which claims priority to U.S. Provisional Patent Application No. 62/342,406, filed May 27, 2016, entitled "Asymmetric Poly Pitch in Transistor Devices," all of which are incorporated herein by reference in their entirety.

BACKGROUND

Field effect transistor (FET) devices typically have a polysilicon gate electrode, silicon dioxide gate dielectric, and source and drain regions formed adjacent to the polysilicon gate electrode. A typical process of fabricating a FET includes growing a thin silicon dioxide gate dielectric on a silicon substrate and then forming the polysilicon gate electrode over the gate dielectric. Source and drain regions are then formed adjacent to the gate electrode. A FET gate length is defined as the distance under the polysilicon gate between the source and drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
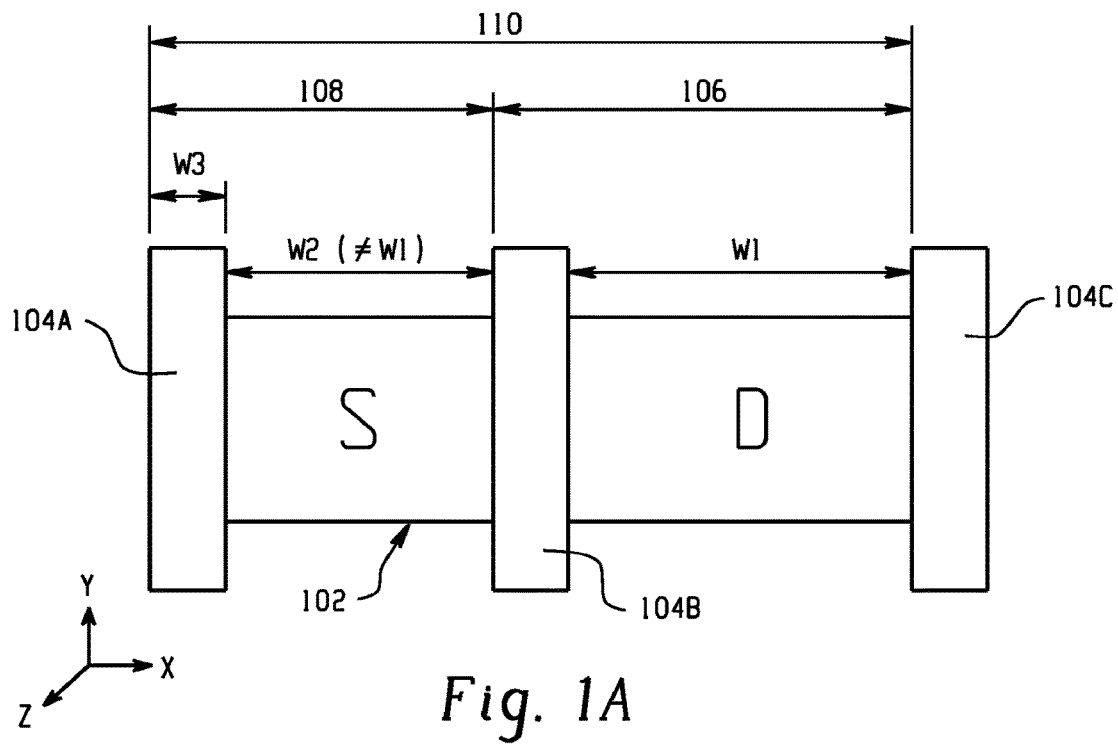
FIG. 1A illustrates an example transistor including asymmetric source and drain regions, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The instant disclosure relates to transistors and methods of forming transistors. In embodiments described herein, an asymmetric transistor structure is formed. The asymmetric transistor structure includes a drain region having a first width and a source region having a second width that is not equal to the first width. The asymmetric transistor structure further includes, in examples, multiple polysilicon gates, where spacings between adjacent polysilicon gates include at least first and second spacings that are not equal. The differing widths of the respective source and drain regions and the non-constant spacing between adjacent polysilicon gates result in a transistor structure that is not symmetric. In embodiments, the asymmetric transistor structure enables improved transistor performance (e.g., higher cutoff frequency, higher transistor speed, etc.) as compared to other symmetric transistors. Embodiments of the asymmetric transistor structure and methods of forming the same are described in detail below.

FIG. 1A illustrates an example transistor including asymmetric source and drain regions, in accordance with some embodiments. The transistor includes an active semiconductor region 102, which includes the regions marked with the labels "S" and "D" in FIG. 1A, disposed in a substrate (e.g., a silicon substrate, etc.). In embodiments, the active semiconductor region 102, which may also be referred to as an oxide definition (OD) region, an active silicon region, or an active device region, is surrounded on all sides by shallow trench isolation (STI) insulator material (not shown), which provides electrical isolation between the active semiconductor region 102 and other semiconductor structures formed in the substrate.

Polysilicon gates 104A, 104B, 104C are formed over the active semiconductor region 102. In embodiments, each of the polysilicon gates 104A, 104B, 104C comprises polysilicon material and functions as a gate for a respective transistor. Further, in embodiments, at least ones of the polysilicon gates 104A, 104B, 104C have a same width "W3," which defines a channel length of a respective transistor. In the example of FIG. 1A, all of the polysilicon gates 104A, 104B, 104C have the same width W3.

Source and drain regions (denoted by the labels "S" and "D," respectively) are formed in the active semiconductor region 102 on opposite sides of the polysilicon gate 104B. In the example of FIG. 1A, the source region, drain region, and polysilicon gate 104B comprise portions of an asymmetric transistor. The asymmetric nature of the transistor is evidenced, for example, in the widths of the respective source and drain regions. In the example of FIG. 1A, the drain region has a first width "W1," and the source region has a second width "W2" that is not equal to the first width W1. Specifically, in the example of FIG. 1A, the second width W2 is less than the first width W1.

The asymmetric nature of the transistor is further evidenced, for example, in the non-constant spacings between the adjacent polysilicon gates 104A, 104B, 104C. In the example of FIG. 1A, a first spacing between the polysilicon gate 104A and the polysilicon gate 104B is not equal to a second spacing between the polysilicon gate 104B and the polysilicon gate 104C. In embodiments, the first spacing between the polysilicon gate 104A and the polysilicon gate 104B defines the second width W2, and the second spacing between the polysilicon gate 104B and the polysilicon gate 104C defines the first width W1. In the example of FIG. 1A, the first spacing is less than the second spacing, consistent with the second width W2 being less than the first width W1, as described above.

With the polysilicon gates 104A, 104B, 104C having the above-described non-constant spacing, the polysilicon gates 104A, 104B, 104C may be understood as having an asymmetric or non-constant pitch. Specifically, positions of the polysilicon gates 104A, 104B, 104C define a drain-side pitch 106 and source-side pitch 108 that are not equal to each other. The drain-side pitch 106 is equal to a sum of the first width W1 and the width W3 of the polysilicon gates 104A, 104B, 104C (i.e., W1+W3), and the source-side pitch 108 is equal to a sum of the second width W2 and the width W3 of the polysilicon gates 104A, 104B, 104C (i.e., W2+W3). As a result of the second width W2 being less than the first width W1 in the example of FIG. 1A, the source-side pitch 108 is less than the drain-side pitch 106.

In embodiments described herein, the polysilicon gates 104A, 104B, 104C are formed using multiple mandrels (e.g., sacrificial patterns, sacrificial masks, etc.). As described below, the multiple mandrels are formed over a layer of polysilicon material and used in patterning the layer of polysilicon material to form the polysilicon gates 104A, 104B, 104C. In embodiments, adjacent mandrels formed over the layer of polysilicon material have a pitch 110. In the example of FIG. 1A, the pitch 110 of the mandrels is equal to W1+W2+(2*W3). It can further be seen that the pitch 110 of the mandrels is equal to the sum of the drain-side pitch 106 and the source-side pitch 108. For a given pitch 110 of the mandrels, increasing the drain-side pitch 106 necessitates a reduction of the source-side pitch 108, and vice versa.

A fabrication process that enables variation of the drain- and source-side pitches 106, 108 for a given pitch 110 of the mandrels is described below with reference to FIGS. 2A-7B. Specifically, as described below, for a given pitch 110 of the mandrels, sizes of the drain- and source-side pitches 106, 108 are varied by controlling a width of the mandrels. For instance, in examples, for the given pitch 110 of the mandrels, decreasing a width of the mandrels decreases the source-side pitch 108 and increases the drain-side pitch 106. Conversely, in examples, for the given pitch 110, increasing a width of the mandrels increases the source-side pitch 108 and decreases the drain-side pitch 106.

In embodiments, for the given pitch 110 of the mandrels, the drain-side pitch 106 and the source-side pitch 108 are selected to optimize (e.g., maximize) one or more parameters of the transistor. For instance, in examples, for the given pitch 110 of the mandrels, the drain-side pitch 106 and the source-side pitch 108 are selected to optimize a cutoff frequency $f_T$ of the transistor. The cutoff frequency $f_T$ is the frequency at which a transistor's current gain drops to unity and is commonly used as a metric for the speed of the transistor.

Figure 1B:
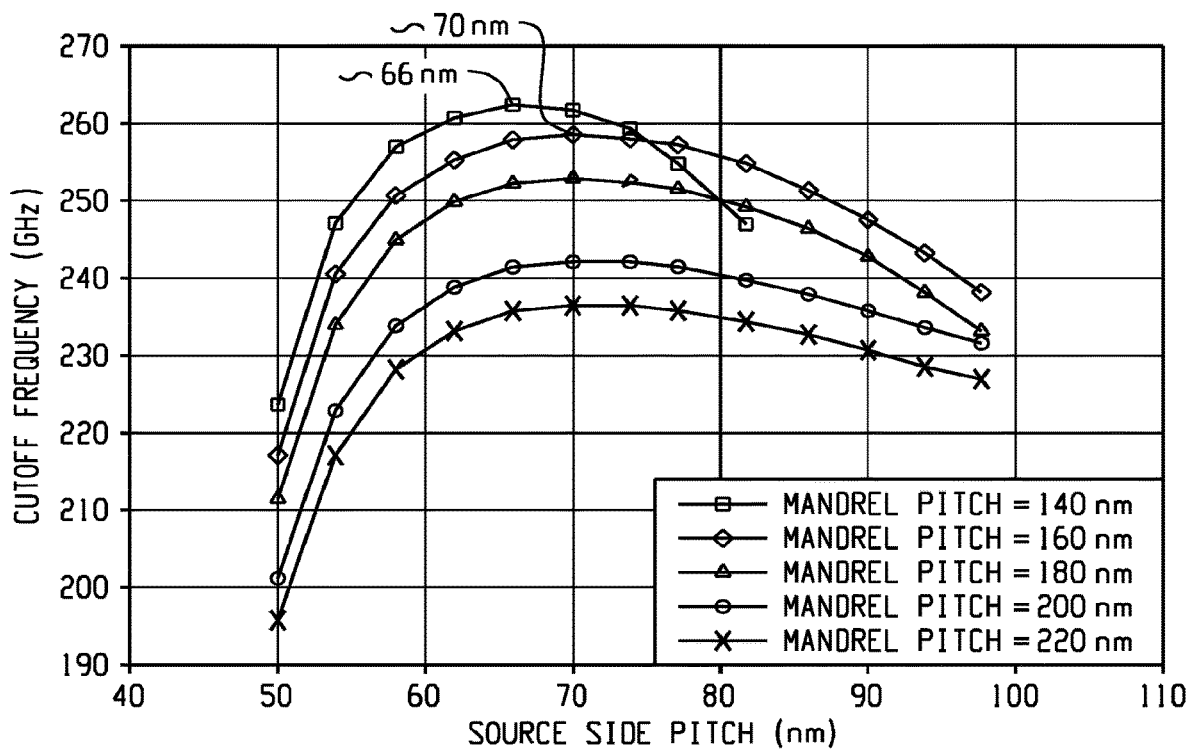
FIG. 1B is a graph showing cutoff frequency as a function of source-side pitch for a transistor, in accordance with some embodiments.

FIG. 1B is a graph showing cutoff frequency $f_T$ as a function of source-side pitch 108 for an example transistor, in accordance with some embodiments. As shown in the graph, for a mandrel pitch 110 that is equal to 140 nm, a maximum cutoff frequency $f_T$ is obtained using a source-side pitch 108 of approximately 66 nm. As explained above, the mandrel pitch 110 is equal to the sum of the drain-side pitch 106 and the source-side pitch 108, such that the drain-side pitch 106 in this design is equal to approximately 74 nm (i.e., 140 nm−66 nm). Likewise, for a mandrel pitch 110 that is equal to 160 nm, a maximum cutoff frequency $f_T$ is obtained using a source-side pitch 108 of approximately 70 nm and a drain-side pitch 106 of approximately 90 nm (i.e., 160 nm−70 nm). For the example of FIG. 1B, it is noted that for each of the mandrel pitches 140 nm, 160 nm, 180 nm, 200 nm, and 220 nm, a maximum cutoff frequency $f_T$ is obtained using a source-side pitch 108 that is less than a drain-side pitch 106.

With reference again to FIG. 1A, the source region has the second width W2 that is less than the first width W1, such that the source-side pitch 108 is less than the drain-side pitch 106. As described above with reference to FIG. 1B, in embodiments, the cutoff frequency $f_T$ for a transistor is increased or maximized through the use of a source-side pitch 108 that is less than a drain-side pitch 106. Thus, the transistor of FIG. 1A may have a higher cutoff frequency $f_T$ as compared to (i) other transistors that utilize drain- and source-side pitches 106, 108 that are equal, and (ii) other transistors that utilize a drain-side pitch 106 that is greater than a source-side pitch 108.

The approaches of the instant disclosure differ from other approaches. In the other approaches, spacings between adjacent polysilicon gates do not vary, such that the drain-side pitch of a transistor is equal to the source-side pitch of the transistor. With the equal drain- and source-side pitches, the transistor of the conventional approaches may be referred to as a "symmetric transistor." In the symmetric transistor, widths of the respective drain and source regions are equal. A cutoff frequency $f_T$ and transistor speed of the symmetric transistor are degraded by parasitic resistances and capacitances that are present in the symmetric transistor.

In contrast to these conventional approaches, under the approaches of the instant disclosure, an asymmetric transistor is formed. Further, in embodiments of the asymmetric transistor described herein, the second width W2 is less than the first width W1, and the source-side pitch 108 is less than the drain-side pitch 106. This design enables the asymmetric transistor to have a higher cutoff frequency $f_T$ as compared to conventional symmetric transistors. In embodiments, a transistor's cutoff frequency $f_T$ is equal to $$f_T = \frac{g_m}{2\pi \times \{C_{gs} + C_{gd}(1 + g_m(R_S + R_D))\}}, \quad \text{(Equation 1)}$$

where $g_m$ is the transconductance of the transistor, $C_{gs}$ is a capacitance between gate and source regions of the transistor, $C_{gd}$ is a capacitance between gate and drain regions of the transistor, $R_S$ is a resistance of the source region, and $R_D$ is a resistance of the drain region.

From Equation 1, it can be seen that by reducing $C_{gs}$ and $C_{gd}$, the cutoff frequency $f_T$ is increased. In embodiments, $C_{gs}$ and $C_{gd}$ are a result of parasitic capacitances present in the transistor. For example, in a Fin Field Effect Transistor (FinFET), such parasitic capacitances include a first parasitic capacitance $C_{co}$ and a second parasitic capacitance $C_{of}$. The first parasitic capacitance $C_{co}$ is a parasitic capacitance between a gate region and an "MD" region of the transistor, where the MD region comprises a connection (e.g., a via) used to connect the OD region to a metal contact. The second parasitic capacitance $C_{of}$ is a parasitic capacitance between the gate region and the fin region of the FinFET.

In examples, the use of the asymmetric transistor having a source-side pitch 108 that is less than the drain-side pitch 106 reduces one or more of the parasitic capacitances present in the transistor. From Equation 1, in addition to $C_{gs}$ and $C_{gd}$, $R_S$ and $R_D$ also degrade $f_T$. Therefore, if $C_{gd}$ can be reduced further, $f_T$ degradation caused by $R_S$ and $R_D$ can be reduced. Hence, by using an asymmetric transistor, $C_{gd}$ is reduced, which increases the transistor's cutoff frequency $f_T$. Accordingly, the asymmetric transistor of the instant application may have a higher cutoff frequency $f_T$ as compared to conventional transistors that have a symmetric structure. The asymmetric transistors having the higher cutoff frequency $f_T$ may be used in constructing high-performance and/or low-power systems and circuits. For instance, a low-noise amplifier (LNA) that utilizes the asymmetric transistors described herein can have a higher gain as compared to LNAs that utilize conventional symmetric transistors at the condition of same power consumption. Further, for instance, an LNA that utilizes the asymmetric transistors described herein can have a lower power consumption as compared to LNAs that utilize conventional symmetric transistors at the condition of the same performance (i.e., gain). It is noted that the approaches of the instant disclosure are applicable in a variety of different transistors (e.g., FinFETs, nanowire FETs, planar FETs, etc.).

Figure 2A:
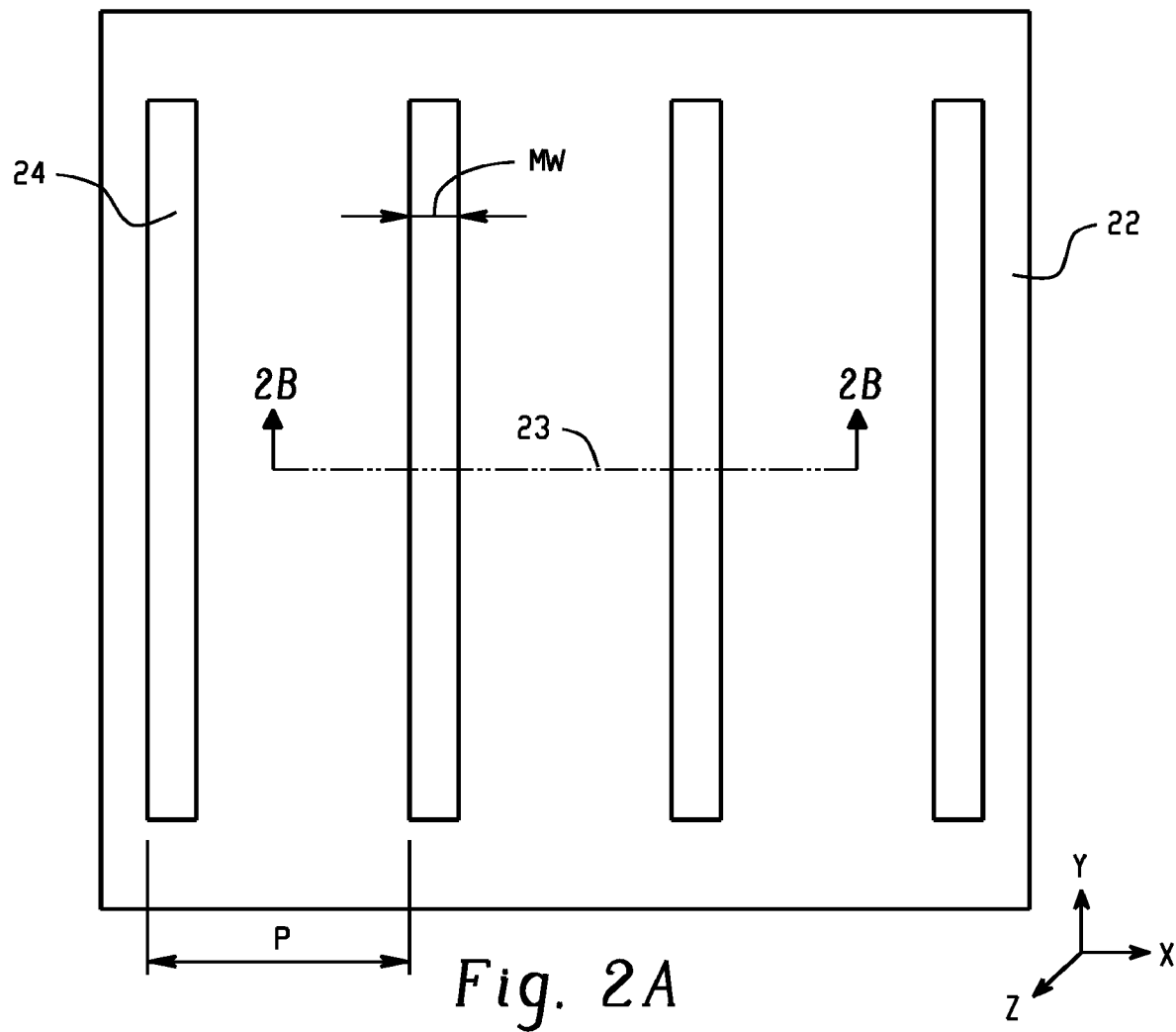
FIGS. 2A-7B illustrate example operations for fabricating a transistor including asymmetric source and drain regions, in accordance with some embodiments.

FIGS. 2A-7B illustrate example operations for fabricating a transistor including asymmetric source and drain regions, in accordance with some embodiments. In FIGS. 2A and 2B, a layer of polysilicon material 22 is formed over a semiconductor substrate 20. FIG. 2A depicts a top-down view of the semiconductor structure, and FIG. 2B depicts a cross-sectional view of the semiconductor structure along a cutline 23. The semiconductor substrate 20 is formed of silicon or other commonly used semiconductor materials, in examples. In examples, an active semiconductor region (e.g., an OD region, such as the region 102 shown in FIG. 1A) is formed in the substrate 20.

Figure 2B:
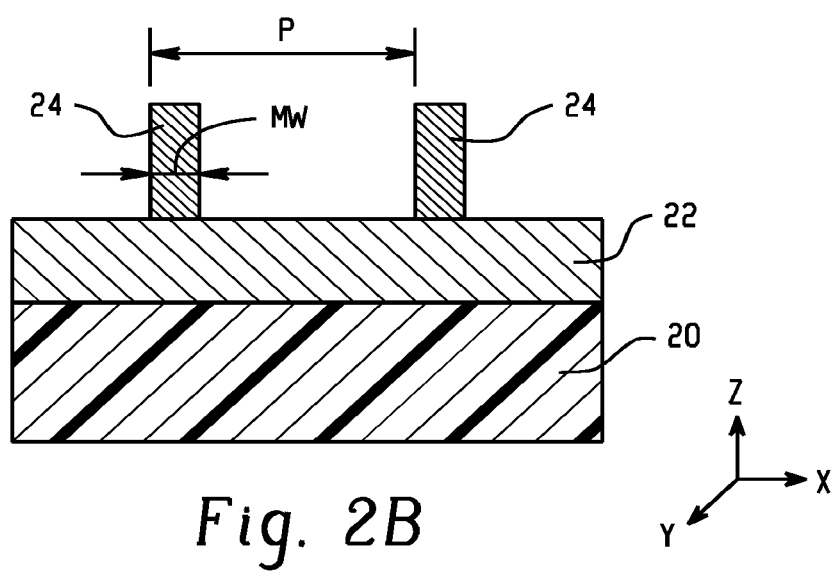

Mandrels 24 (e.g., sacrificial patterns, sacrificial masks, etc.) are formed on the layer of polysilicon material 22. In an example, the mandrels 24 are formed of silicon nitride, although other materials are used in other examples. Adjacent mandrels 24 have a pitch P, and at least ones of the mandrels 24 have a same width MW. In the example of FIGS. 2A and 2B, the pitch P is constant for the mandrels 24 shown, such that a spacing between each set of adjacent mandrels 24 is the same. Further, in the example of FIGS. 2A and 2B, each of the mandrels 24 has the same width MW. As described below, polysilicon gates for an asymmetric transistor are formed by etching the layer of polysilicon material 22, with a pattern of the polysilicon gates being defined by a pattern of the mandrels 24.

Figure 3A:
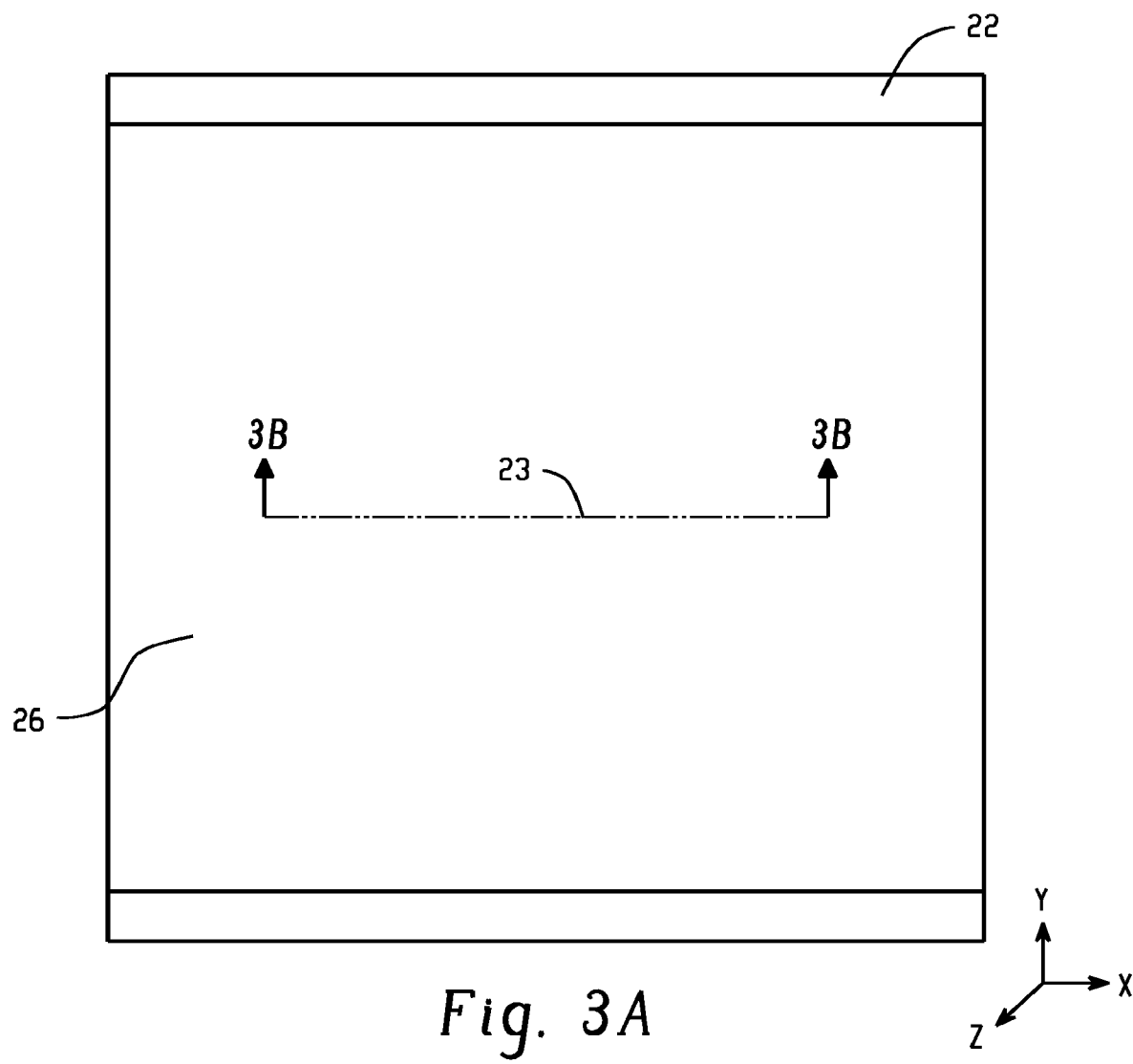
Figure 3B:
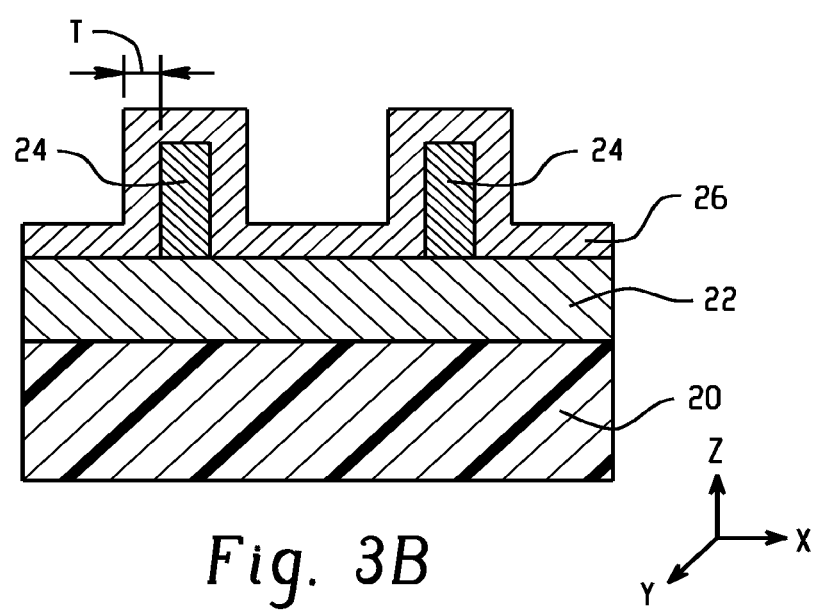
Figure 4A:
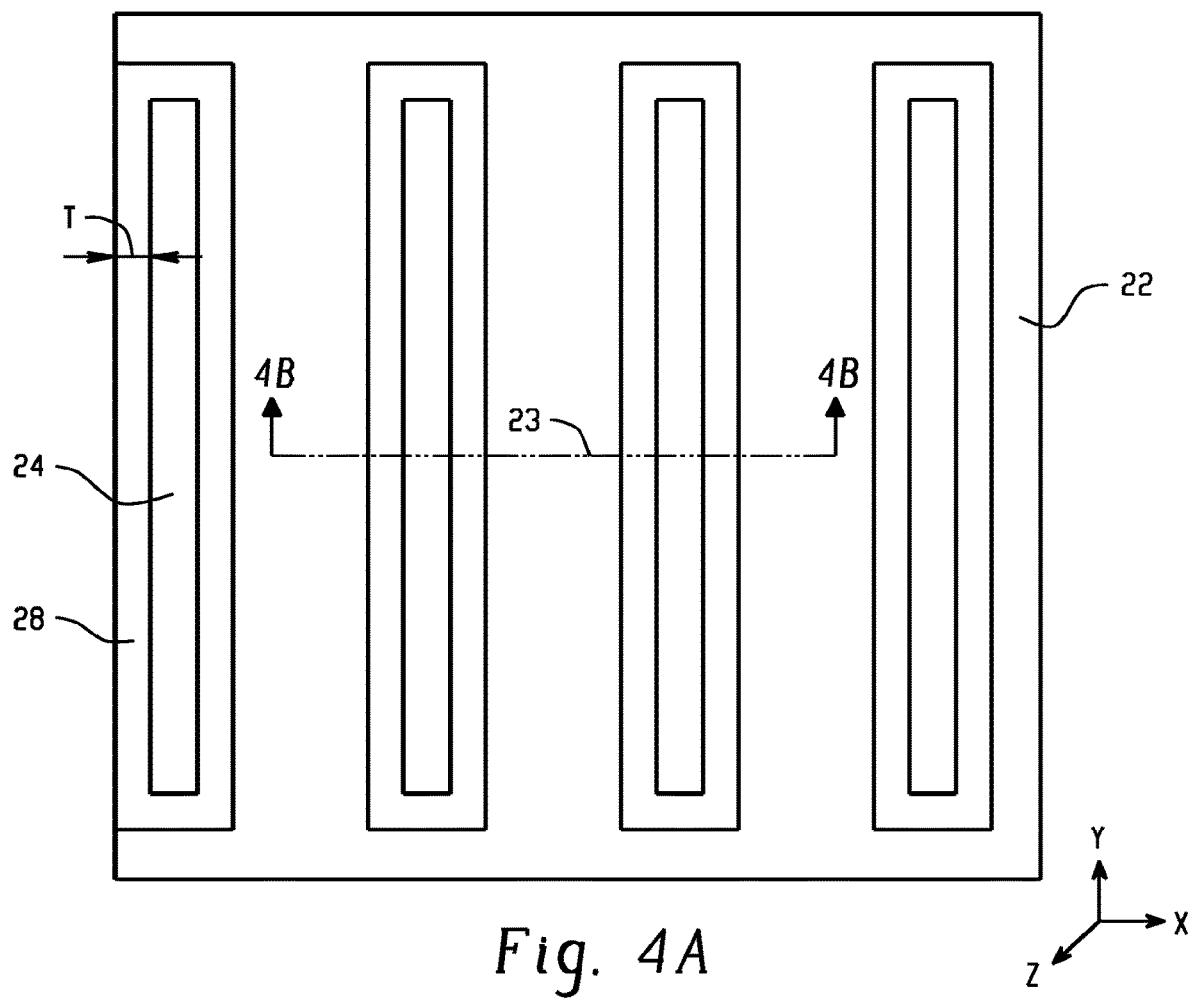
Figure 4B:
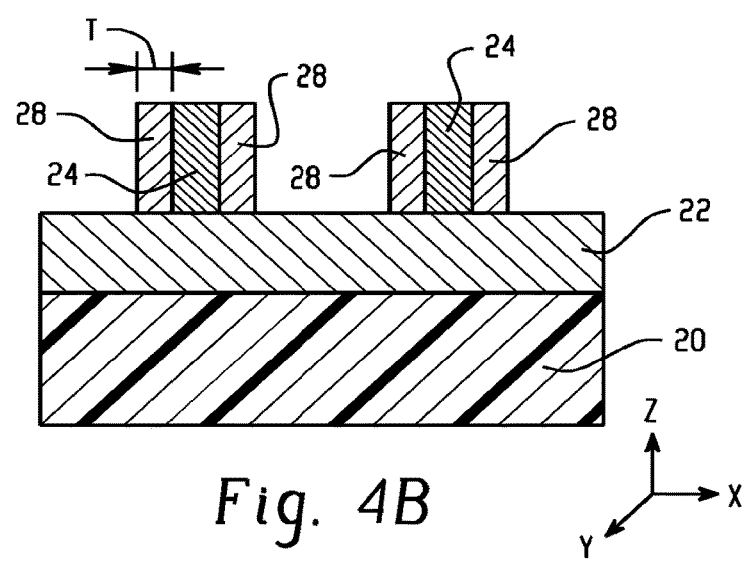

In FIGS. 3A and 3B, a spacer layer 26 is formed on the top surfaces and sidewalls of the mandrels 24. In embodiments, the spacer layer 26 includes SiN (silicon nitride). As shown in FIG. 3B, the spacer layer 26 has a thickness T. In FIGS. 4A and 4B, the spacer layer 26 is etched, so that the horizontal portions of the spacer layer 26 are removed, and the vertical portions of the spacer layer 26 on the sidewalls of the mandrels 24 are left to form spacers 28. The spacers 28 on the sidewalls of the mandrels 24 have the same thickness T as the spacer layer 26.

Figure 5A:
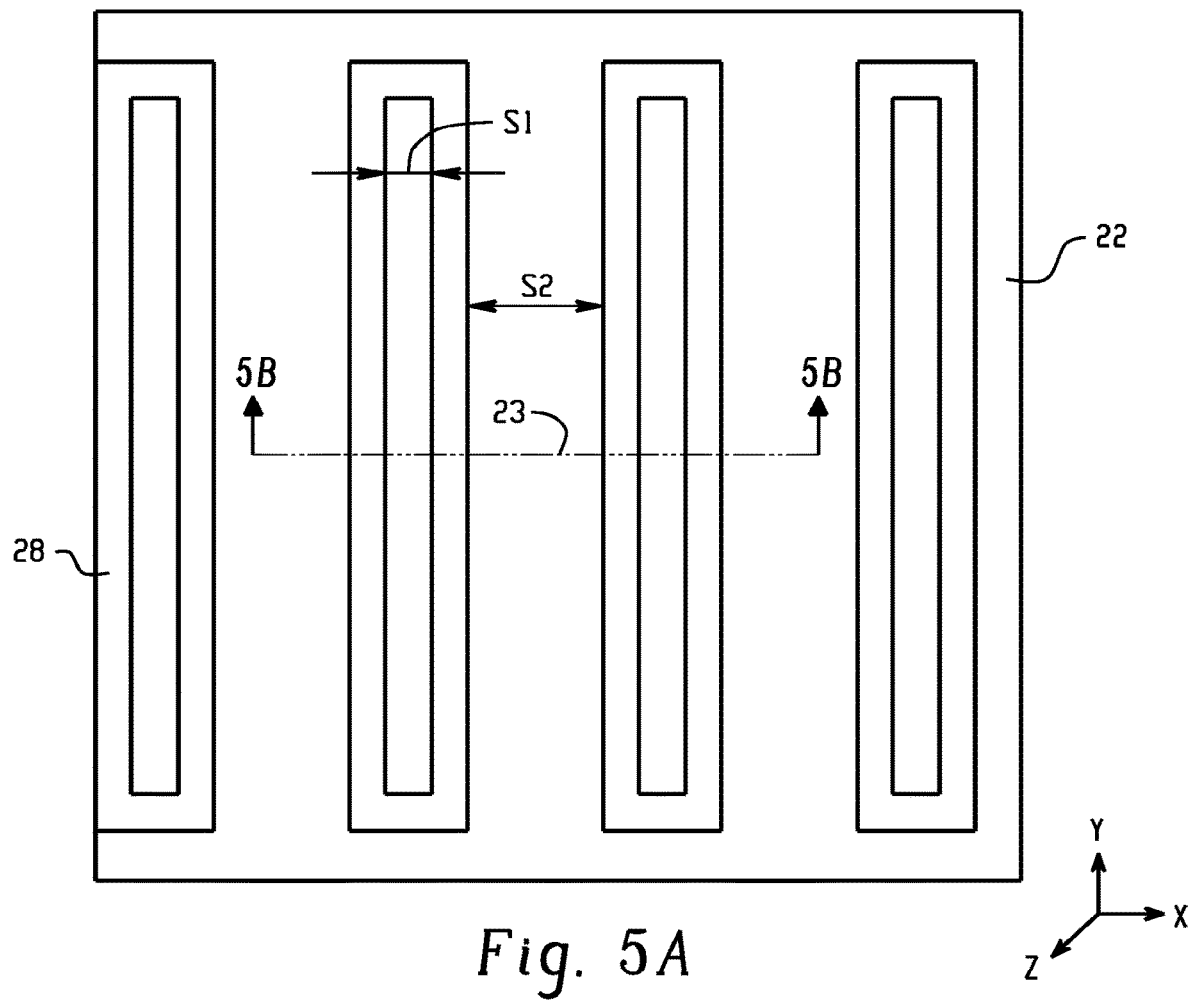
Figure 5B:
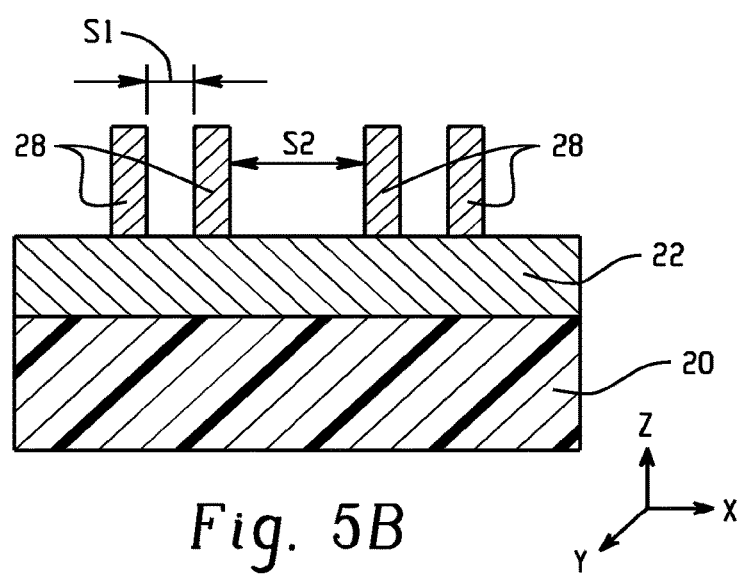
Figure 6:
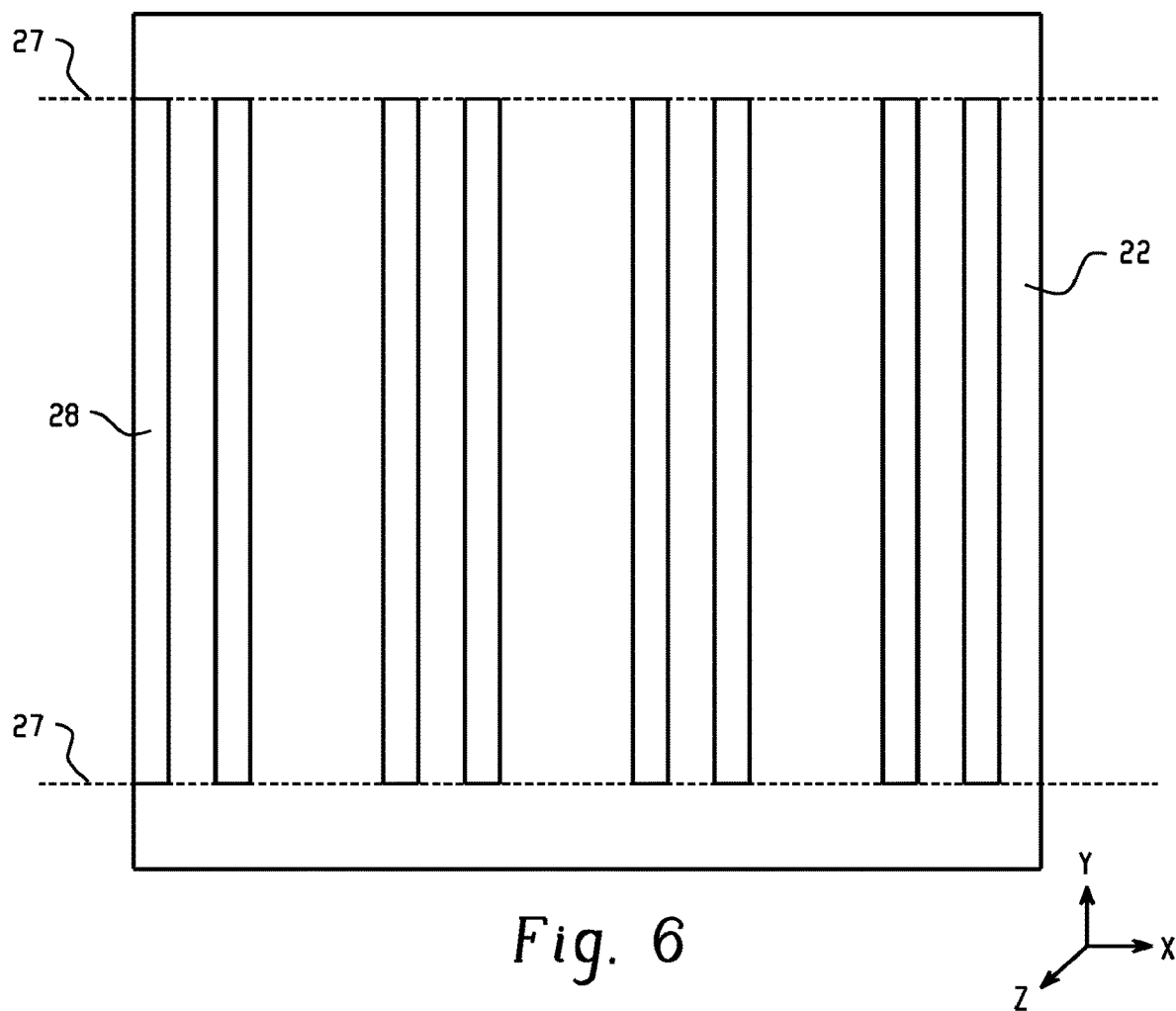

Next, as shown in FIGS. 5A and 5B, the mandrels 24 are removed by etching, and the spacers 28 are left un-removed. As can be seen in FIGS. 5A and 5B, spacings between adjacent spacers 28 include a first spacing "S1" and a second spacing "S2" that is not equal to the first spacing S1. After removing the mandrels 24, a line-end cut is performed to cut the spacers 28, as shown in FIG. 6. As seen in the figure, the line-end cut removes end portions of the spacers 28 that are formed beyond lines 27. Prior to the line-end cut, pairs of spacers 28 are connected via the end portions. After the line-end cut, such pairs of spacers 28 are no longer connected in this manner.

Figure 7A:
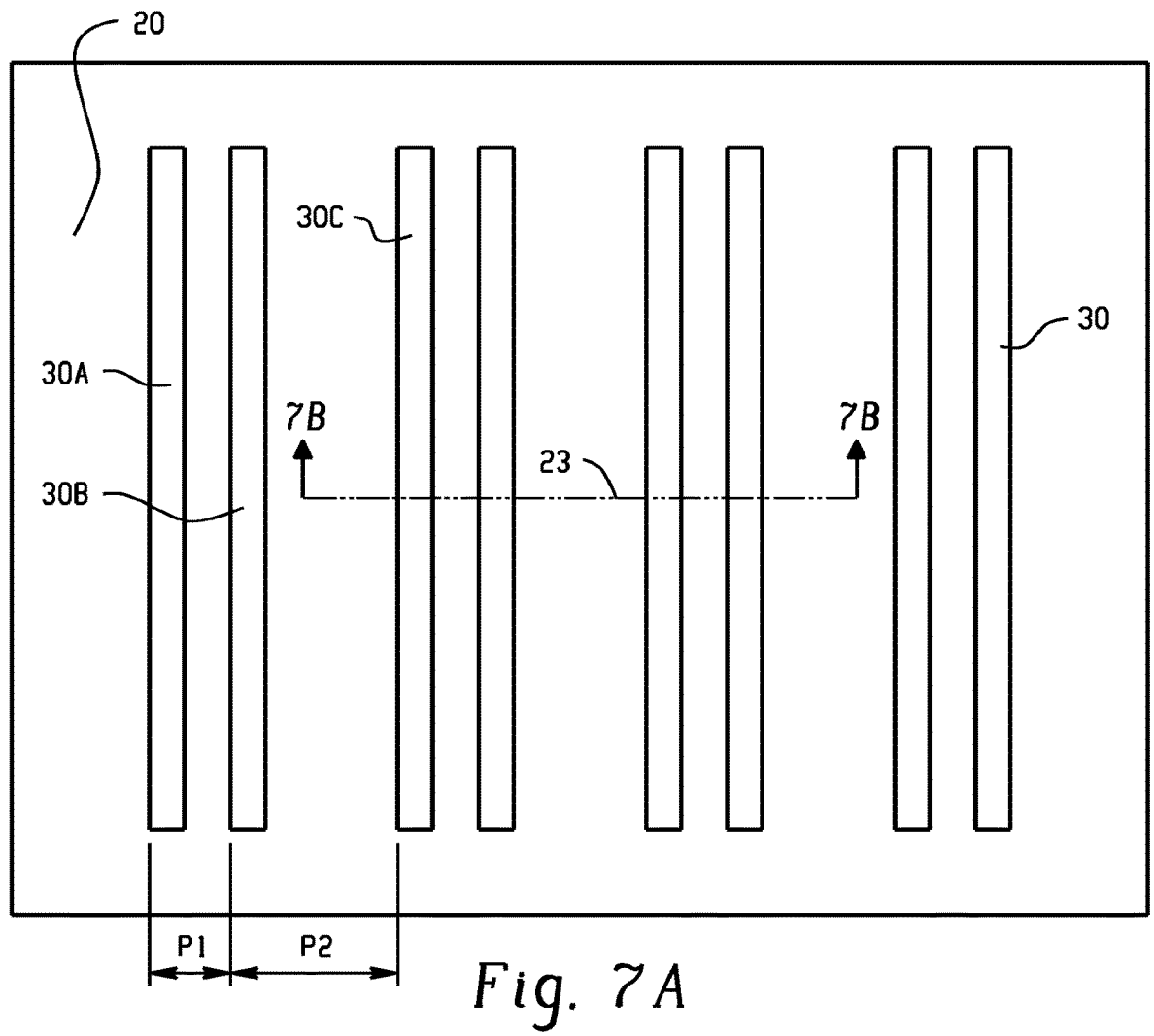
Figure 7B:
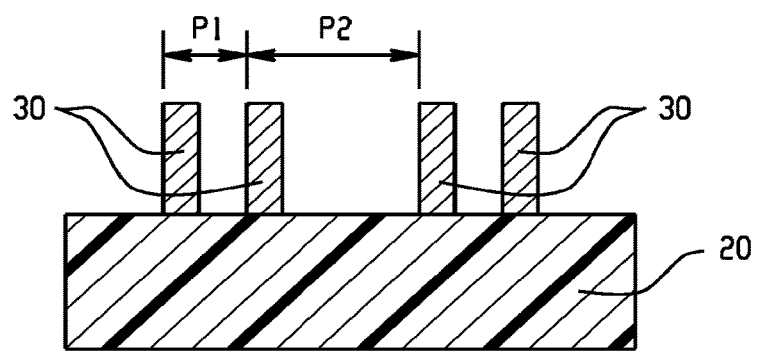

In FIGS. 7A and 7B, the spacers 28 are used to etch the layer of polysilicon material 22 to form multiple polysilicon gates 30 over the substrate 20. It is thus noted that a pattern of the polysilicon gates 30 is defined by a pattern of the spacers 28. Following the etching, the spacers 28 are removed, leaving the polysilicon gates 30 shown in FIGS. 7A and 7B. As shown in FIG. 7A, there are non-constant spacings between adjacent polysilicon gates 30. For instance, a first spacing between the polysilicon gate 30A and the polysilicon gate 30B is not equal to a second spacing between the polysilicon gate 30B and the polysilicon gate 30C. In the example of FIG. 7A, the first spacing is less than the second spacing.

With the polysilicon gates 30 having such non-constant spacing, the polysilicon gates 30 may be understood as having an asymmetric or non-constant pitch. Specifically, positions of the polysilicon gates 30 define a first pitch P1 and a second pitch P2 that are not equal to each other. In embodiments, the first pitch P1 defines a width of a source region of a transistor (e.g., the source region shown in FIG. 1A) and may be referred to as a source-side pitch, and the second pitch P2 defines a width of a drain region of a transistor (e.g., the drain region shown in FIG. 1A) and may be referred to as a drain-side pitch. A sum of the pitches P1 and P2 is equal to the mandrel pitch P shown in FIGS. 2A and 2B. The source-side pitch P1 is less than the drain-side pitch P2.

In the example of FIGS. 2A-7B, for a given pitch P of the mandrels 24, sizes of the source- and drain-side pitches P1, P2 are varied by controlling the mandrel width MW. The mandrel width MW is shown in FIGS. 2A and 2B. For instance, in examples, for the given pitch P of the mandrels 24, decreasing the mandrel width MW decreases the source-side pitch P1 and increases the drain-side pitch P2. Conversely, in examples, for the given pitch P of the mandrels 24, increasing the mandrel width MW increases the source-side pitch P1 and decreases the drain-side pitch P2.

In embodiments, for a given mandrel pitch P, a maximum cutoff frequency $f_T$ for a transistor is obtained using a source-side pitch P1 that is less than a drain-side pitch P2. A mandrel width MW equal to $$\left(\frac{P}{2} - T\right)$$

results in a source-side pitch P1 that is equal to the drain-side pitch P2, where T is the thickness of the spacers 28, as described above. Thus, in embodiments, to achieve the source-side pitch P1 that is less than the drain-side pitch P2, the mandrels 24 are fabricated to have a mandrel width MW according to $$MW < \left(\frac{P}{2} - T\right).$$

In the example of FIGS. 2A-7B, the spacers 28 are used as masks for etching the layer of polysilicon material 22. In other examples, the spacers 28 are used as masks to etch a hard mask layer, and the etched hard mask layer is subsequently used as a mask for etching the layer of polysilicon material 22. The hard mask layer can be a composite layer comprising a plurality of dielectric layers, such as a plasma enhanced oxide layer, a silicon oxynitride layer, an amorphous carbon layer, and/or the like.

Figure 8:
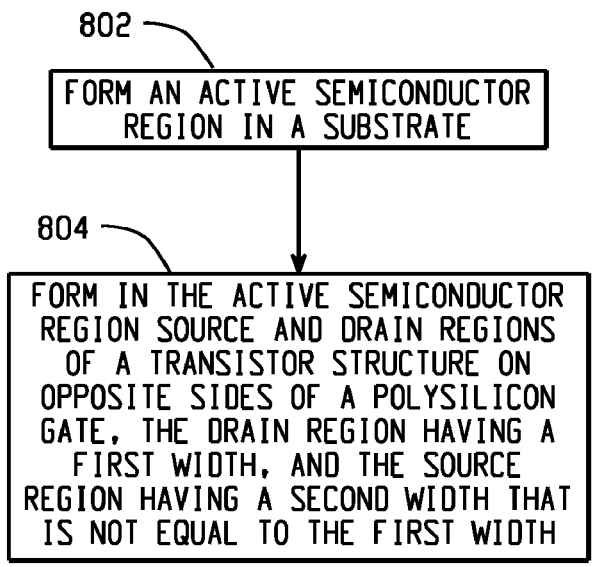
FIG. 8 is a flowchart depicting steps of an example method for forming a semiconductor structure, in accordance with some embodiments.

FIG. 8 is a flowchart depicting steps of an example method for forming a semiconductor structure, in accordance with some embodiments. At 802, an active semiconductor region is formed in a substrate. At 804, a polysilicon gate of a transistor is formed over the substrate. The transistor further includes source and drain regions in the active semiconductor region on opposite sides of the polysilicon gate. The drain region has a first width, and the source region has a second width that is not equal to the first width.

Figure 9:
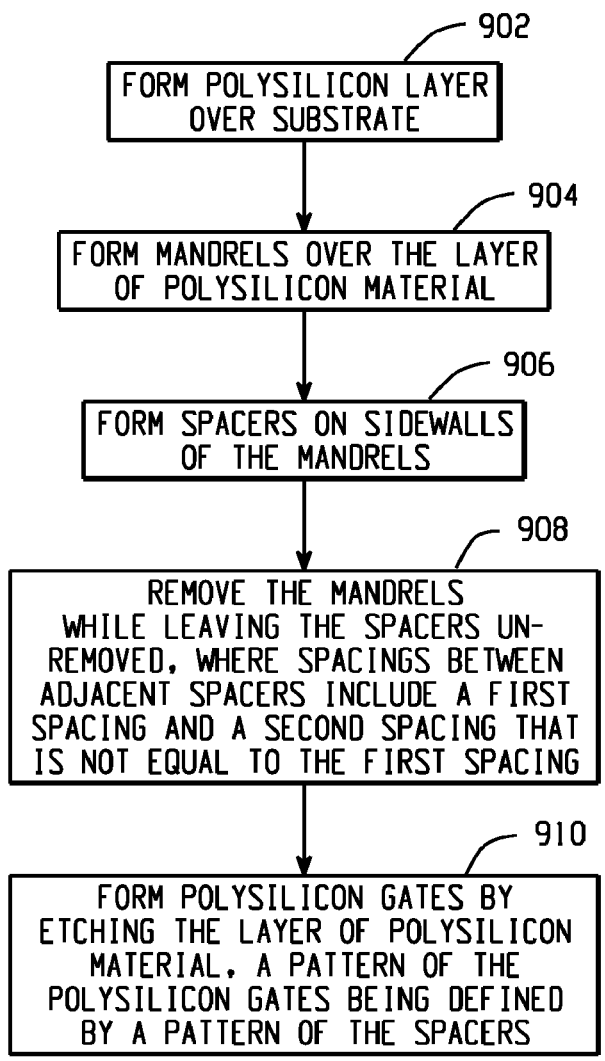
FIG. 9 is a flowchart depicting steps of another example method for forming a semiconductor structure, in accordance with some embodiments.

FIG. 9 is a flowchart depicting steps of another example method for forming a semiconductor structure, in accordance with some embodiments. At 902, a layer of polysilicon material is formed over a substrate. At 904, mandrels are formed over the layer of polysilicon material. At 906, spacers are formed on sidewalls of the mandrels. At 908, the mandrels are removed via an etching procedure while leaving the spacers un-removed. Spacings between adjacent spacers include a first spacing and a second spacing that is not equal to the first spacing. At 910, after the removing of the mandrels, multiple polysilicon gates are formed in the layer of polysilicon material by etching the layer of polysilicon material. A pattern of the multiple polysilicon gates is defined by a pattern of the spacers.

The present disclosure is directed to semiconductor structures and methods for forming a semiconductor structure. An example semiconductor structure includes an active semiconductor region disposed in a substrate. The semiconductor structure also includes a gate formed over the substrate. The semiconductor structure further includes source and drain regions of a transistor formed in the active semiconductor region on opposite sides of the gate. The drain region has a first width, and the source region has a second width that is not equal to the first width.

In an example method of forming a semiconductor structure, an active semiconductor region is formed in a substrate. A gate of a transistor is formed over the substrate. The transistor further includes source and drain regions in the active semiconductor region on opposite sides of the gate. The drain region has a first width, and the source region has a second width that is not equal to the first width.

In another example method of forming a semiconductor structure, a layer of material is formed over a substrate. Mandrels are formed over the layer of material. Spacers are formed on sidewalls of the mandrels. The mandrels are removed via an etching procedure while leaving the spacers un-removed. Spacings between adjacent spacers include a first spacing and a second spacing that is not equal to the first spacing. After the removing of the mandrels, multiple gates are formed in the layer of material by etching the layer of material. A pattern of the multiple gates is defined by a pattern of the spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming an active semiconductor region in a substrate; and
    forming at least three gates of a transistor over the substrate;
    forming source regions and drain regions in the active semiconductor region on opposite sides of each of the at least three gates,
    selecting a combination of a source side pitch and a drain side pitch of the transistor that will yield a desired cutoff frequency for the transistor, wherein the desired cutoff frequency is between 190 GHz and 270 GHz,
    wherein a source region corresponding to a first gate of the at least three gates and a source region corresponding to a second gate of the at least three gates coincide and have a first width, and
    wherein a drain region corresponding to the second gate of the at least three gates and a drain region corresponding to a third gate of the at least three gates coincide and have a second width that is not equal to the first width.

2. The method of claim 1, wherein the second width is greater than the first width.

3. The method of claim 1, wherein spacings between adjacent gates in the at least three gates include a first spacing and a second spacing that is not equal to the first spacing.

4. The method of claim 3, wherein the first spacing defines the first width and the second spacing defines the second width, the first spacing being less than the second spacing.

5. The method of claim 3, wherein the at least three gates define a drain-side pitch and a source-side pitch of the transistor, wherein the drain-side pitch is equal to a sum of the first width and a width of one of the at least three gates, and wherein the source-side pitch is equal to a sum of the second width and the width of the one of the at least three gates, the source-side pitch being less than the drain-side pitch.

6. The method of claim 3, wherein the forming of the at least three gates comprises:
    forming a layer of material over the substrate;
    forming mandrels over the layer of material; and
    forming the at least three gates by etching the layer of material, wherein a pattern of the at least three gates is defined by a pattern of the mandrels.

7. The method of claim 6,
    wherein adjacent mandrels have a pitch P, and
    wherein the at least three gates define a drain-side pitch and a source-side pitch of the transistor, the source-side pitch being less than the drain-side pitch, and a sum of the drain-side pitch and source-side pitch being equal to P.

8. The method of claim 6, wherein adjacent mandrels have a pitch P, the method further comprising:
    forming a spacer layer having a thickness T on sidewalls of the mandrels, wherein at least one of the mandrels have a mandrel width MW according to $$MW < \left(\frac{P}{2} - T\right).$$

9. The method of claim 8, wherein the thickness T of the spacer layer defines a width of the at least three gates.

10. A method of forming a semiconductor structure, the method comprising:
forming an active semiconductor region in a substrate;
forming at least three gates of a transistor over the substrate;
forming source regions and drain regions in the active semiconductor region on opposite sides of each of the at least three gates; and
determining a desired cutoff frequency for the transistor, wherein determining the desired cutoff frequency for the transistor comprises selecting a combination of a source side pitch and a drain side pitch of the transistor that will yield the desired cutoff frequency;
wherein the cutoff frequency corresponds to a frequency at which a current gain of the transistor drops to unity; and
wherein the desired cutoff frequency is between 190 GHz and 270 GHz.

11. The method of claim 10, wherein a source region corresponding to a first gate of the at least three gates and a source region corresponding to a second gate of the at least three gates coincide and have a first width.

12. The method of claim 11, wherein a drain region corresponding to the second gate of the at least three gates and a drain region corresponding to a third gate of the at least three gates coincide and have a second width that is not equal to the first width.

13. The method of claim 10, wherein the source-side pitch and the drain-side pitch of the transistor are defined by the at least three gates.

14. The method of claim 10, wherein the transistor is a field effect transistor.

15. The method of claim 10, wherein the field effect transistor is a FinFET, a nanowire FET, or a planar FET.

16. The method of claim 10, wherein the forming of the at least three gates comprises:
forming a layer of material over the substrate;
forming mandrels over the layer of material; and
forming the at least three gates by etching the layer of material, wherein a pattern of the at least three gates is defined by a pattern of the mandrels.

17. A method of forming a semiconductor structure, the method comprising:
forming an active semiconductor region in a substrate;
forming at least three gates of a transistor over the substrate by etching a layer of material over the substrate;
forming source regions and drain regions in the active semiconductor region on opposite sides of each of the at least three gates; wherein a source region corresponding to a first gate of the at least three gates and a source region corresponding to a second gate of the at least three gates coincide and have a first width, and wherein a drain region corresponding to the second gate of the at least three gates and a drain region corresponding to a third gate of the at least three gates coincide and have a second width that is not equal to the first width; and
determining a desired cutoff frequency for the transistor, wherein the desired cutoff frequency is between 190 GHz and 270 GHz, which corresponds to a source side pitch of the transistor between 50 nm to 100 nm;
wherein the source-side pitch of the transistor is equal to a sum of the second width and the width of the one of the at least three gates.

18. The method of claim 17, wherein the wherein the second width is greater than the first width.

19. The method of claim 17, wherein the layer of material comprises polysilicon.

20. The method of claim 17, wherein the forming of the at least three gates comprises:
forming mandrels over the layer of material, wherein adjacent mandrels have a pitch between 140 to 220 nm.

* * * * *